(12) United States Patent
Ackerson et al.

(10) Patent No.: US 8,304,257 B2
(45) Date of Patent: Nov. 6, 2012

(54) MONOLAYER-PROTECTED GOLD CLUSTERS: IMPROVED SYNTHESIS AND BIOCONJUGATION

(75) Inventors: Christopher J. Ackerson, Raleigh, NC (US); Pablo Jadzinsky, Stanford, CA (US); Roger D. Kornberg, Atherton, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 1463 days.

(21) Appl. No.: 11/715,563

(22) Filed: Mar. 8, 2007

(65) Prior Publication Data
US 2007/0269594 A1    Nov. 22, 2007

Related U.S. Application Data

(60) Provisional application No. 60/780,571, filed on Mar. 9, 2006.

(51) Int. Cl.
*G01N 33/53* (2006.01)
(52) U.S. Cl. ...................................... 436/525
(58) Field of Classification Search ............... 436/525
See application file for complete search history.

(56) References Cited

U.S. PATENT DOCUMENTS

| | | | |
|---|---|---|---|
| 5,041,195 A * | 8/1991 | Taylor et al. | 205/508 |
| 5,973,116 A | 10/1999 | Epentos | |
| 6,979,729 B1 * | 12/2005 | Sperling et al. | 536/23.1 |
| 2004/0115345 A1 | 6/2004 | Huang et al. | |
| 2004/0152212 A1 | 8/2004 | Huang et al. | |

OTHER PUBLICATIONS

Brust et al. "Synthesis and Reactions of Functionalised Gold Nanoparticles" J. Chem. Soc. Chem. Commun., 1998, pp. 1655-1656.*
Ackerson et al. "Rigid, Specific, and Discrete Gold Nanoparticle/Antibody Conjugates" J. Am. Chem. Sco. 2006, 128, 2635-2640.*
Ackerson, C. J., et al., "Defined DNA/Nanoparticle Conjugates." Proc Natl Acad Sci USA, Sep. 20, 2005, vol. 102, No. 38, 13383-13385.
Ackerson, C. J., et al., "Thiolate Ligands for Synthesis of Water-Soluble Gold Clusters." J. Am. Chem. Soc., 2005, vol. 127, 6550-6551.

* cited by examiner

*Primary Examiner* — Mark Shibuya
*Assistant Examiner* — Pensee Do
(74) *Attorney, Agent, or Firm* — Bozicevic, Field & Francis LLP; Pamela J. Sherwood

(57) ABSTRACT

Improved methods for preparing thiolate passivated gold nanoparticles are provided resulting in a narrower size distribution. By alternating oxidation and reduction of the particles, after oxidation, the thiolates may be readily displaced with a different thiol, followed by reduction to prevent further reaction. Proteins can be rigidly bound to the gold nanoparticles by binding an scFv for a target protein to the gold nanoparticles, where the scFv prior or subsequent to binding to the gold nanoparticles may be complexed with the target protein. The protein is rigidly held and its structure readily determined using electron microscopy.

10 Claims, 8 Drawing Sheets

4A

4B

MONOLAYER-PROTECTED GOLD CLUSTERS: IMPROVED SYNTHESIS AND BIOCONJUGATION

CROSS REFERENCE TO RELATED APPLICATIONS

This application claims priority to provisional application Ser. No. 60/780,571, filed Mar. 9, 2006, hereby incorporated by reference in its entirety.

STATE OF GOVERNMENT SUPPORT

This invention was made with Government support under contracts GM063025, GM008294, and AI021144 awarded by the National Institutes of Health. The Government has certain rights in this invention.

REFERENCE TO SEQUENCE LISTING

A paper copy of a Sequence Listing identical to a Sequence Listing in computer readable form will follow.

BACKGROUND OF THE INVENTION

1. Field of the Invention

This invention is concerned with gold nanoparticles, their preparation and their use.

2. Related Art

Background

There is substantial interest in providing monolayer-protected gold clusters ("MPCs") that are substantially uniform in dimensions and composition, are stable, highly reactive in aqueous media, so as to permit high yield substitutions, and for structure determinations provide rigidity to proteins bound to the MPCs. MPC compositions possessing these characteristics would greatly improve many of the present applications and afford new opportunities for exploitation.

Gold nanoparticle/protein conjugates are finding increasing application as biochemical sensors (Thanh, N. T. K.; Rosenzweig, Z., "Development of an aggregation-based immunoassay for anti-protein A using gold nanoparticles," *Analytical Chemistry* 2002, 74, (7), 1624-1628. Schneider, B. H.; Dickinson, E. L.; Vach, M. D.; Hoijer, J. V.; Howard, L. V., "Highly sensitive optical chip immunoassays in human serum," *Biosensors & Bioelectronics* 2000, 15, (1-2), 13-22.), enzyme enhancers (Gole, A.; Dash, C.; Ramakrishnan, V.; Sainkar, S. R.; Mandale, A. B.; Rao, M.; Sastry, M., "Pepsin-Gold Colloid Conjugates: Preparation, Characterization, and Enzymatic Activity," *Langmuir* 2001, 17, (5), 1674-1679. Xiao, Y.; Patolsky, F.; Katz, E.; Hainfeld, J. F.; Willner, I., "Plugging into Enzymes: nanowiring of redox enzymes by a gold nanoparticle," *Science* 2003, 299, (5614), 1877-81.), nanoscale building blocks (Blum, A. S.; Soto, C. M.; Wilson, C. D.; Cole, J. D.; Kim, M.; Gnade, B.; Chatterji, A.; Ochoa, W. F.; Lin, T.; Johnson, J. E.; Ratna, B. R., "Cowpea Mosaic Virus as a Scaffold for 3-D Patterning of Gold Nanoparticles," *Nano Letters* 2004, 4, (5), 867-870.), and immunohistochemical probes (Hainfeld, J. F., "Labeling with nanogold and undecagold: techniques and results," *Scanning Microscopy, Supplement* 1996, 10, (Science of Biological Specimen Preparation for Microscopy), 309-325. Safer, D.; Hainfeld, J.; Wall, J. S.; Reardon, J. E., "Biospecific labeling with undecagold: visualization of the biotin-binding site on avidin," *Science* 1982, 218, (4569), 290-1.)

Two chemistries have been developed for forming nanoparticle/protein conjugates: the reaction of protein sulfhydryls with functionalized phosphine-protected undecagold and nanogold; and electrostatic interaction of proteins with citrate-passivated colloidal gold. Neither of these conjugation strategies can produce a specific, linker-free, bond between a nanoparticle and a protein. These limitations have prevented certain applications of gold nanoparticles (Jensen, G. J.; Kornberg, R. D., "Single-particle selection and alignment with heavy atom cluster-antibody conjugates," *Proc Natl Acad Sci USA* 1998, 95, (16), 9262-7.) from being implemented, and have prevented others from being fully realized (Xiao, Y.; Patolsky, F.; Katz, E.; Hainfeld, J. F.; Willner, I., "Plugging into Enzymes: nanowiring of redox enzymes by a gold nanoparticle," *Science* 2003, 299, (5614), 1877-81. On the web, Physorg.com, the section on Nanotechnology describes memory devices, stabilized platinum electrocatalysts, fuel cells, gold catalysis for oxidation of carbon monoxide to carbon dioxide at room temperatures (13:13, Jun. 22, 2006), and catalysis of NADH to $NAD^+$ (Huang, et al., *J Photochem Photobiol B* 2005 81:76-83). Controlled production of gold nanoparticles offers increasing opportunities for improved or new applications.

MPCs differ from the gold nanoparticles traditionally used for bioconjugation in their extraordinary stability and size-dependent optical, catalytic and capacitance properties (Jahn, W., "Review: Chemical Aspects of the Use of Gold Clusters in Structural Biology," *Journal of Structural Biology* 1999, 127, (2), 106-112. One- and two-phase syntheses of MPCs afford synthetic control over particle size, dispersity, and surface functionality (Templeton, A. C.; Wuelfing, W. P.; Murray, R. W., Monolayer-Protected Cluster Molecules. *Accounts of Chemical Research* 2000, 33, (1), 27-36.). The adaptation of MPCs for water solubility has enabled their conjugation to proteins and DNA. Derivatization of the MPC monolayer with ethidium bromide (Wang, G.; Zhang, J.; Murray, R. W., "DNA binding of an ethidium intercalator attached to a monolayer-protected gold cluster," *Analytical Chemistry* 2002, 74, (17), 4320-4327.) and biotin) Zheng, M.; Huang, X., "Nanoparticles Comprising a Mixed Monolayer for Specific Bindings with Biomolecules," *Journal of the American Chemical Society* 2004, 126, (38), 12047-12054.) have been reported for binding duplex DNA and streptavidin. Thiolated single stranded DNA Ackerson, C. J., "Defined DNA/Nanoparticle Conjugates," *Proc Natl Acad Sci USA* 2005. Jhaveri, S. D.; Foos, E. E.; Lowy, D. A.; Chang, E. L.; Snow, A. W.; Ancona, M. G., "Isolation and characterization of trioxyethylene-encapsulated gold nanoclusters functionalized with a single DNA strand," *Nano Letters* 2004, 4, (4), 737-740.) and glutathione (Zheng, M.; Huang, X., "Nanoparticles Comprising a Mixed Monolayer for Specific Bindings with Biomolecules," *Journal of the American Chemical Society* 2004, 126, (38), 12047-12054.) have been incorporated in the MPC monolayer for hybridization with complementary DNA and for binding glutathione-S-transferase. A method for coupling a physiologically compatible MPC to virtually any biological particle has been put forward (Tshikhudo, T. R.; Wang, Z.; Brust, M., "Biocompatible gold nanoparticles," *Materials Science and Technology* 2004, 20, (8), 980-984.), as has a method for general functionalization of water soluble MPCs (Templeton, A. C.; Cliffel, D. E.; Murray, R. W., "Redox and Fluorophore Functionalization of Water-Soluble, Tiopronin-Protected Gold Clusters," *Journal of the American Chemical Society* 1999, 121, (30), 7081-7089. (All of the references cited in this and the preceding paragraphs are specifically incorporated herein by reference.)

Relevant Literature

Reviews of interest include Marie-Christine Daniel and Didier Astruc, "Gold Nanoparticles: Assembly, Surpamolecular Chemistry, Quantum-Size-Related Properties, and Applications toward Biology, Catalysis, and Nanotechnology," *Chem Rev.* 2004, 104, 293-346 and Wener Jahn, "Review: Chemical Aspects of the Use of Gold Clusters in Structural Biology," *J of Structural Biology*, 1999, 127, 106-112. Other relevant articles include, Christopher J. Ackerson, Michael T. Sykes and Roger D. Kornberg, *J Am Chem Soc*, 2004, 102, 13383-95 and Christopher J., Ackerson, Pablo D. Jadzinsky and Roger D. Kornberg, *J Am Chem Soc*, 2005, 127, 6650-1, whose disclosures are specifically incorporated herein by reference.

BRIEF SUMMARY OF THE INVENTION

Thiolate passivated gold nanoparticles are provided having uniform size and controlled activity, as well as crystals of the nanoparticles. Particularly, nanoparticles compositions are prepared having specific numbers of gold atoms. Also, crystals are formed of nanoparticles. The nanoparticle composition is prepared in a hydrophilic medium. The product is produced in two stages, a first stage reacting thiolate with auric salt leading to an aurous gold thiolate composition followed by reduction in a precipitating medium. The resulting nanoparticles are uniform in size and include a substantial proportion of nanoparticle molecules of specific composition and size. A method is also provided for controlled reactivity of thiolate passivated gold nanoparticles. In addition, methods are provided for producing crystals of uniform composition from gold nanoparticles dispersions.

DESCRIPTION OF THE SPECIFIC EMBODIMENTS

Figure 1:
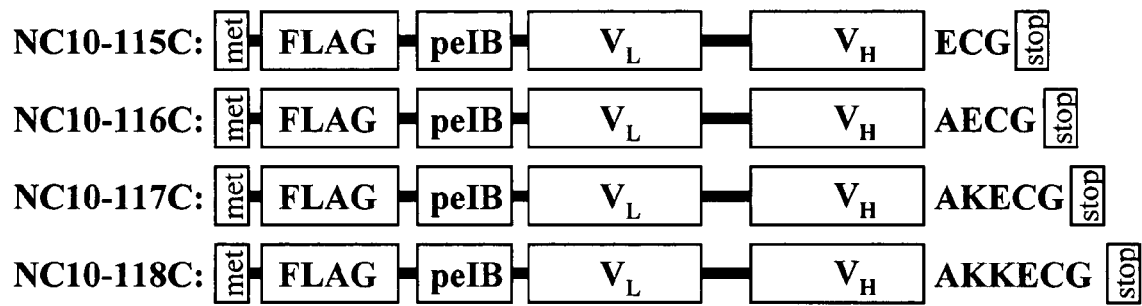
FIG. 1 depicts a nested set of NC10 scFv mutants. Motifs of the NC10 scFv gene are depicted as follows: met, the start codon; FLAG, an affinity purification tag; pelB, the leader sequence that directs delivery of the scFv into the periplasm of *E. coli*; VL, the light chain of the scFv, which is followed by a 15 amino acid $(Gly_4Ser)_3$ linker; VH, the heavy chain of the scFv, followed by a C-terminal tail of varying length, which includes a cysteine residue and, in two cases, lysine residues. NC10-115C contains SEQ ID NO: 19; NC10-116C contains SEQ ID NO: 20, NC10-117C contains SEQ ID NO: 21; NC10-118C contains SEQ ID NO: 22.
Figure 2:
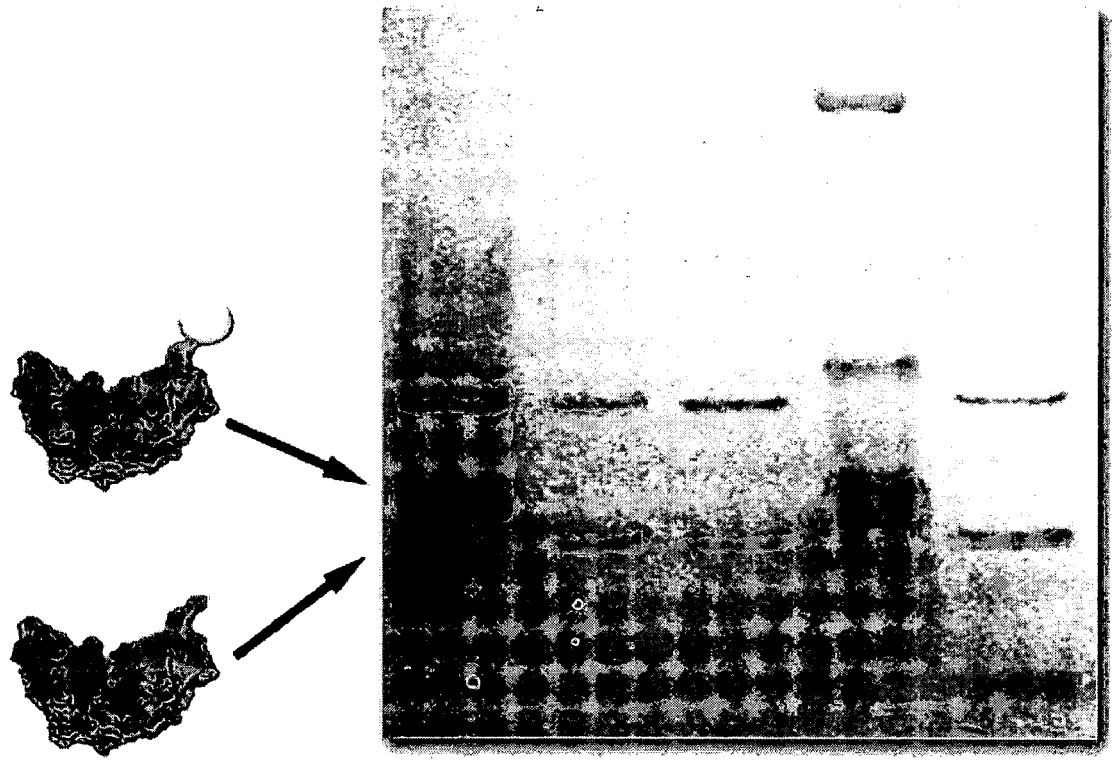
FIG. 2 shows the gel results of the reaction of NC10-116C scFv with $Au_{71}$ MPC. An SDS gel stained with Coomassie Brilliant Blue and also stained for gold is shown. In lane 1, the MPC was oxidized with potassium permanganate. The scFv appears as two bands due to some formation of a covalent (S—S bridged) dimer. In lane 2, the MPC was oxidized with quinhydrone. In lane 3, no MPC was added. Lane 4 contains Bio-Rad kaleidoscope markers. In lane 5, the MPC was unoxidized. The cartoon shows the bound and unbound molecules at different bands.
Figure 3:
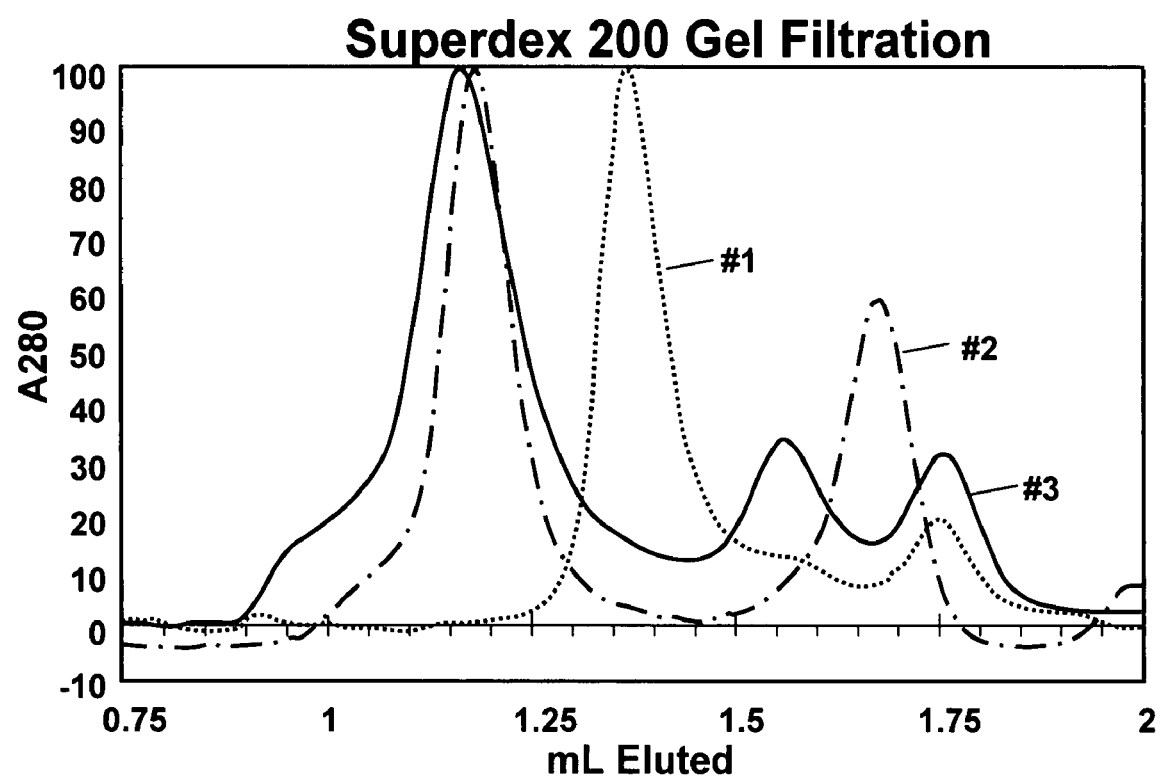
FIG. 3 shows a graph of the Superdex 200 gel filtration for Separation of $Au_{71}$ MPC, $Au_{71}$ MPC-scFv conjugate, and $Au_{71}$ MPC-scFv-neuraminidase complex by gel filtration. #1 trace, neuraminidase alone, showing two peaks, the neuraminidase (left) and an inert contaminant (right). #2 trace, neuraminidase mixed with excess, monomeric, scFv, showing two peaks, the neuraminidase complexed with four scFvs (left) and free scFv (right). #3 trace, neuraminidase mixed with excess $Au_{71}$-scFv conjugate, showing three peaks, the neuraminidase complexed with four conjugates (left), excess conjugate (middle), and free conjugate together with the inert contaminant in the neuraminidase preparation.
Figure 4:
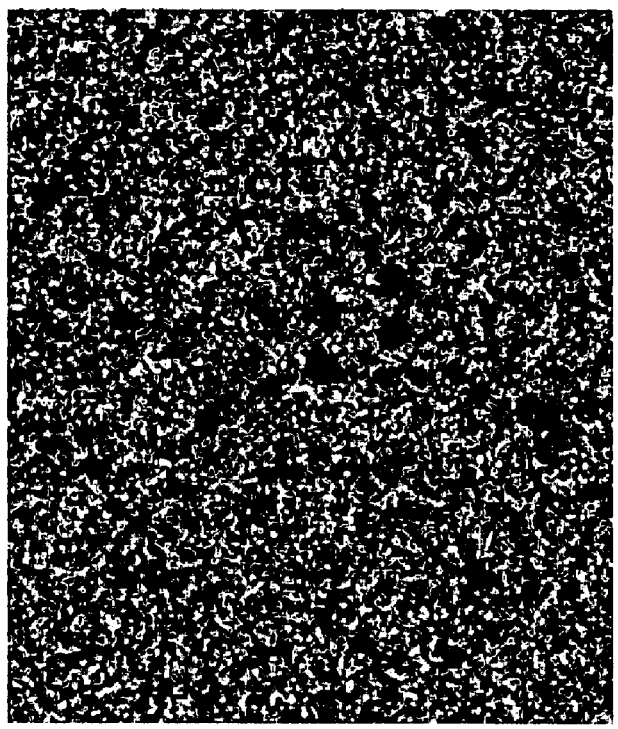
FIG. 4 shows cryoelectron micrographs of $Au_{71}$ MPC-scFv-neuraminidase complex. Images recorded at 1μ underfocus (4A, upper panel) and 4μ underfocus (4B, lower panel).
Figure 4:
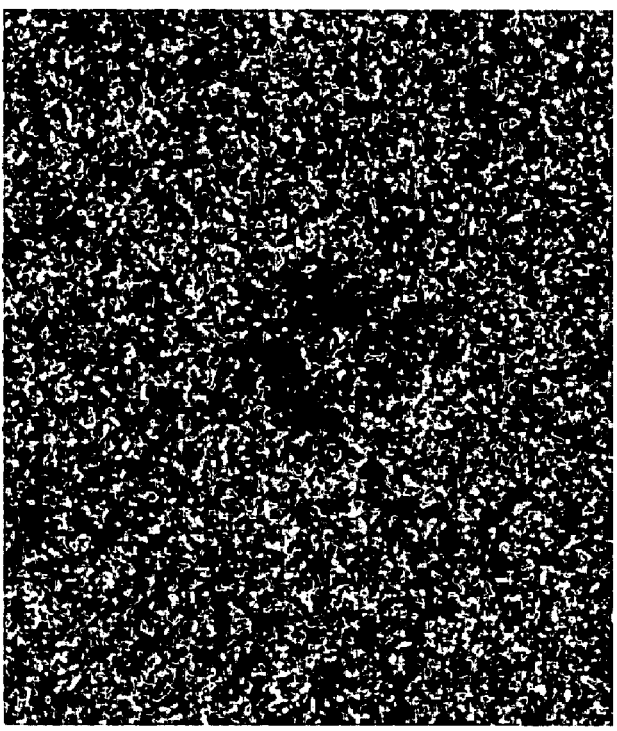
Figure 5:
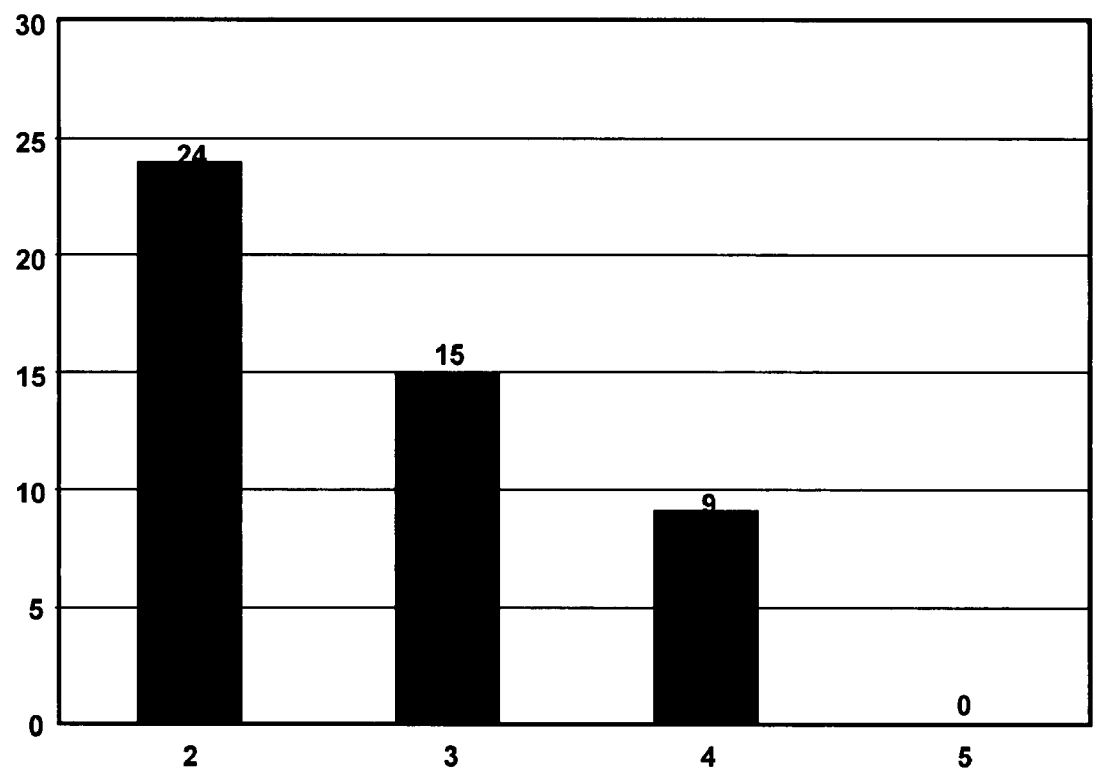
FIG. 5 is a histogram of the distribution of observed gold cluster conjugates by cryoelectron microscopy.
Figure 6:
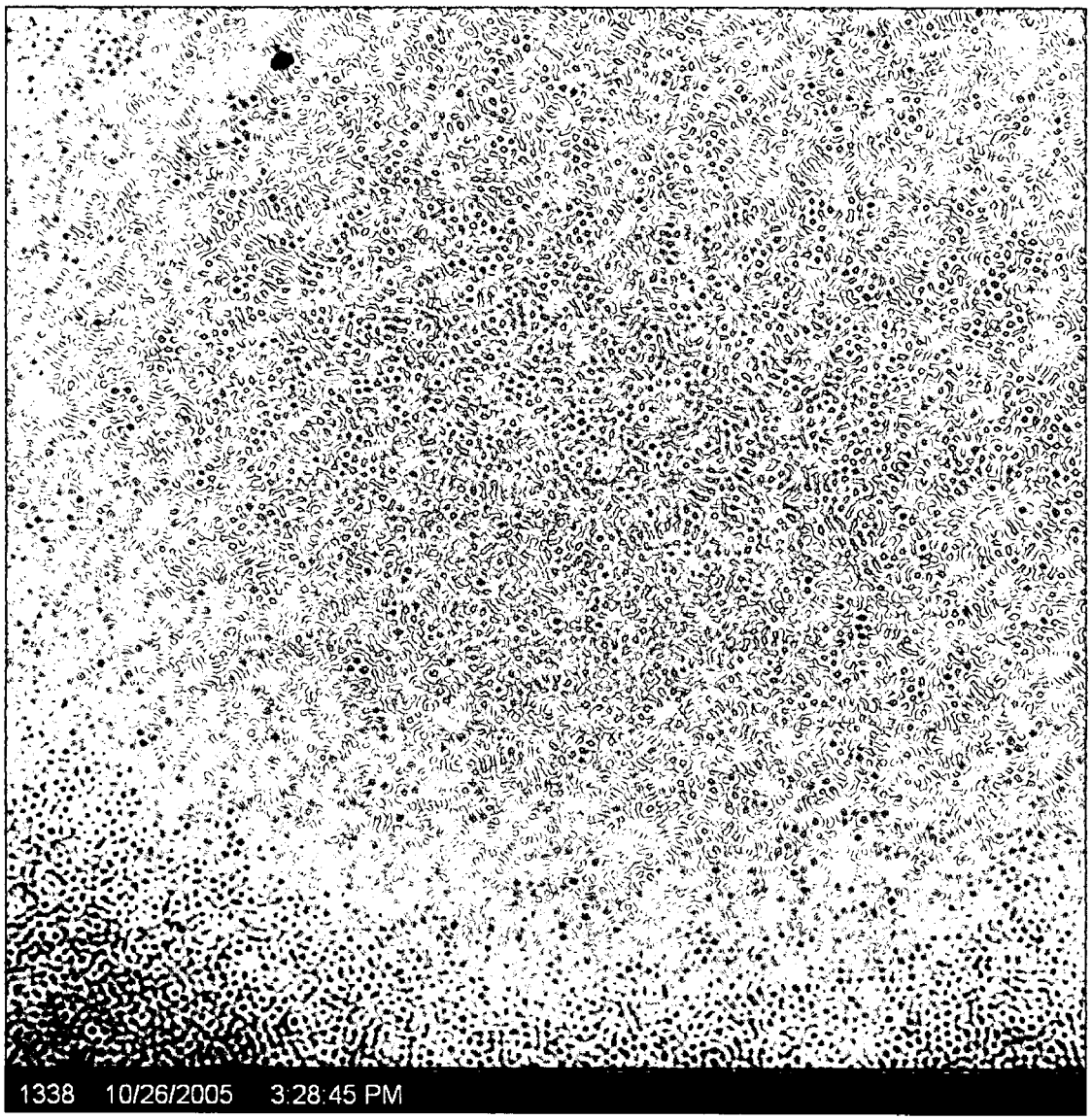
FIG. 6 is an electron micrograph of MPCs produced according to the preparation described in the experimental section.

Thiolate passivated gold nanoparticle compositions are provided having substantially uniform size, that is, low dispersivity, and crystals of gold nanoparticles having a uniform number of gold atoms that may come from the low or higher dispersivity compositions. The compositions are prepared in two stages: a first stage combines auric salts with reducing thiolates resulting in an aurous thiolate composition; the second stage adds a reductant to the aurous thiolate composition in a precipitating medium to provide thiolate passivated gold particles or monolayer protected gold clusters ("MPCs") of substantially uniform size, generally under 10 nm. It is found that the products are highly soluble (dispersible) in water and relatively insoluble in methanol and other organic solvents, so that one can readily provide a mixed solvent solution for precipitating the MPCs, can dissolve the particles in water and use the particles in an aqueous medium for performing various reactions, particularly replacing the thiolates with other compounds, which may then be reacted further.

Also provided are crystals of gold nanoparticles that can be obtained from the monodispersed gold compositions described previously or more heterogeneous gold nanoparticle compositions. Methods are provided for precipitating the gold nanoparticles from a hydroxylic dispersion to result in the gold nanoparticle crystals.

The thiolate groups bound to the gold particles are readily displaced with Lewis bases, particularly other chalcogenides of atomic number 16 to 34, more particularly sulfur, as well as such Lewis bases as compounds of Group V of the Periodic chart, such as nitrogen, e.g., amines, phosphorous, e.g., phosphines, and the like. The reactivity is controlled by first oxidizing the gold nanoparticles with a mild oxidant and addition of a substituting Lewis base usually a chalcogenate, e.g., thiolate, followed by reducing the gold nanoparticles with a mild reductant to inhibit further action.

The subject monodispersed compositions have a narrow size range, and in addition, more particularly, a uniform composition of a specific number of gold atoms, in effect molecules of a defined composition. The monodispersed compositions are substantially uniformly sized in that at least about 90, usually at least about 95 number percent are within 5%, usually within about 2%, of the average size or number of Au atoms in the particles. The number of gold atoms in at least 90, usually at least 95%, of the particles will be in the range of about 8 to 1,000, usually in the range of about 50 to 750, more usually in the range of about 75 to 500, atoms and will differ in number % by 5% or less, usually by 2% or less.

Of particular interest are compositions of gold nanoparticle molecules that have a defined number of gold atoms and are substantially free of gold nanoparticle molecules that have a different number of gold atoms, generally the composition will be at least about 50 number %, more usually at least about 75 number %, preferably at least about 95 number %, more preferably at least about 99 number %, and can conveniently be effectively 100 number %. These molecules will generally be less than about 10 nm, more usually not more than about 5 nm, and generally at least about 0.5 nm, more usually at least about 1 nm. As reported in the Experimental section, particles of 1 nm, 2 nm and 3 nm have been prepared where the 1.5 nm particle has 104 Au atoms, the 2 nm particle 144 Au atoms, and the like. The monodispersed particles are provided as dispersion, generally having from about 0.1 to 99.5, more usually about 1 to 95, weight percent of the gold nanoparticles in an appropriate medium where the particles may be in a solvent or non-solvent. Alternatively, the gold nanoparticles may be present as a precipitate, where the precipitate may be amorphous, partially crystalline or crystalline.

In addition to the monodispersed gold nanoparticles, the gold nanoparticles are provided as crystals. The crystals will generally be not more than about 1 mm, usually not more than about 0.5 mm, in size. The crystals will generally be substantially pure, having at least about 95 weight % of gold nanoparticle molecules having the same number of gold atoms in each molecule. The gold nanoparticles are found to have a non-uniform surface and its substituents will have different reactivities, so that substituents bound to the gold nanoparticles can be differentially displaced to provide particles having a distribution of different compounds bound to the nanoparticles. By appropriate choice of displacing compounds and conditions, individual gold nanoparticles are provided with a variety of capabilities that can provide a range of activities. See, for example, DeVries et al., *Science* 2007 315:358-361.

For the various uses, the particles may be coated on different substrates, such as silicon, amorphous and crystalline, zeolites, silicates, metals, plastics, etc. By the interaction between the subject nanoparticles and the substrate, new properties are achieved, such as catalytic activity, redox activity, etc.

The compositions of this invention find use in a broad spectrum of applications. They can be used to rigidly support proteins. Because of the rigid binding, the resulting protein-particle composition finds use in structure determinations, particularly with electron transmission micrographs. The compositions may be used as labels, catalysts, for supporting nucleic acid, detecting transport with and within cells, therapeutics, in mass spectrometry, gel electophoresis, Southern, Northern and Western transfers, biolistics (shooting the particles into cells for introducing a variety of agents into the cells) and many more applications as described in the aforementioned references. In addition, like the carbon nanoparticles, the subject particles may be transferred through the cellular membrane by passive or active mechanisms, such as endocytosis, etc. Alternatively, cell-penetrating peptides providing for transport across the plasma membrane may be bound to the subject gold nanoparticles to allow for transport into the cell, e.g., tat and maurocalcine.

By virtue of the uniform composition of the mono-dispersed MPCs, one has molecules of specific numbers of gold atoms. These compositions will have specific physical and chemical properties, such as spectroscopic, light absorption, exhibit spectral band in visible region, enhance fluorescence, etc. The particles will have a discrete number of charges, so that under an applied voltage, one will see discrete steps. Plasmon resonance will be observed in the 400 to 600 nm wavelength region, where the light absorbed will be affected by the entities bound to the particles, where changes in the entities result in a change in the spectral properties. These compositions can be used where one wishes or needs to have a uniform composition in order to ensure that the properties of the composition are constant and reproducible. For example, using the MPCs as drugs when conjugated to biologically active molecules, the subject compositions provide for a pure, uniform composition of defined properties. The subject compositions can be conjugated with polyamide nucleic acids that have high binding affinity for complementary nucleic acid sequences, where networks can be produced that are electrically conductive.

The subject preparations employ auric salts, a thiolate, a reductant, and a basic hydroxylic medium. In addition the temperature may be varied. Thus, the concentrations of the individual components, their ratios, the hydroxide concentration, and the temperature affect the nature of the product, whether monodispersed or polydispersed, as well as the individual size for the monodispersed, and range of sizes for the polydispersed. In addition, the amount of one of the variables may affect the response to another variable as to the nature of the product. In one series of studies having a high hydroxide concentration resulted in a substantially reduced response to variations in alkanol content.

In performing the preparation of the gold nanoparticles, various auric salts may be used. These are substantially described in the literature and include halides, e.g., chloride, bromide, etc. Initially the auric salt and the thiolate may be combined in a relatively concentrated medium and, as appropriate, further diluted in the reduction step. The concentration of the auric salt in the initial reaction medium will generally be in the range of about 1 to 50 mM, more usually about 5 to 25 mM, where the concentration is not critical.

Also included in the initial reaction will be the thiolate reactant. For the most part, the thiolate reactant will be soluble in polar solvents, particularly hydroxylic solvents, more particularly aqueous alkanol, more particularly aqueous alkanol or water, conveniently aqueous methanol at basic pH, generally greater than about pH 7 and may be as high as 1N or greater, more usually 8-12. Various bases, particularly inorganic bases can be employed, conveniently alkali metal hydroxides. As sodium is a convenient counterion, it will generally be the one of choice. The alkanol will generally be substantially soluble in water, usually dissolving at least 10 weight %, more usually of from 1 to 6 carbon atoms, usually 1 to 3 carbon atoms, particularly methanol and ethanol.

The thiolate will usually have at least three carbon atoms and no upper limit other than convenience, the selection of the thiolate is governed in part by having at least the size of 2,3-dihydroxypropylmercaptan, being soluble in a non-precipitating aqueous medium and neutral or negatively charged. The thiolate may have a wide variety of functional groups, such as oxo carbonyl-aldehyde and ketone-unreactive non-oxo-carbonyl-carboxylic acid, anhydride, ester, and amide (excludes most acyl halides), cyano, nitro, inorganic acid derivatives, e.g., phospho and boro derivatives-acids, esters, amides and anhydrides, their sulfur and amino analogs, oxyhydroxyl and ether-, amino—including I°, II°, III°, and IV°, where any positive charge will have the alternate charge, e.g., zwitterionic, where the substituents may be hydrocarbon or substituted hydrocarbon, as well as carbocyclic and heterocyclic, with functional groups coming within the groups set forth above, as well as nitrogen derivatives, such as azo, azoxy, and diazo, organic and inorganic salts of the above ions, and the like. Complex thiolates may be used, both naturally occurring and synthetic, including oligomers, e.g., oligopeptides, of from about 2 to 30 units, thio analogs of purines, pyrimidines, nucleotides and nucleosides, aptamers, and amide linked nucleic acid analogs.

The particular thiolate that is used will be selected in accordance with the purposes for which the nanoparticles are used, ease of substitution and separation, whether there is to be substitution on the gold surface or on the thiolate, and desired solubility as a function of both pH and solvent polarity. There may be more than one thiol compound used, usually one or two thiol compounds. Also, the thiol compounds may have more than one thiol group, usually not more than two thiol groups, where the thiol groups will be separated by a linker of at least three atoms in the chain. Also, there may be functional groups for linking other entities, such as coupling acyl groups with hydroxyl or amino substituted compounds, hydroxyl groups with acyl or active halides and pseudohalides, amino groups with acyl, active halo and oxo groups, and the like.

Illustrative thiolates may be found in Ackerson, et al., PNAS, supra. Of particular interest for monomercapto thiolates are thiol substituted carboxylic acids, e.g., p-mercaptobenzoic acid, and other mercaptoaromatic carboxylic acids of from 5 to 20, usually 7 to 20, carbon atoms and from 0 to 4 heteroatoms, carbocyclic or heterocyclic, generally having from 5 to 6 annular members, as well as being substituted by the above indicated groups, that may be present as annular atoms or as substituents, mercaptoalkanoic acids of from 3 to 20 carbon atoms, where the mercapto group is distant from the carboxy group, being separated by at least 2 carbon atoms, for a 1-carboxy compound, at least at the 3-carbon, amino acids, e.g., cysteine, mercaptobenzonitriles, tiopronin, glutathione, CoA, thiosugars, etc. In many cases one thiolate will be preferred to another and various stabilities may be obtained depending upon the particular thiolate used. Therefore, while the subject invention provides for a variety of useful thiolates, evaluating others will be empirical. The selection of other thiolates can be based on those found to be useful and screening is easily and rapidly performed.

The number of the thiolates will generally be greater than equimolar to the number of auric atoms, conveniently at least 1.5 times the number of auric atoms and generally not more than about 10 times. Generally, the mole ratio of thiolates to auric ions will be in the range of about 1.5-10:1, more usually in the range of about 2-10: 1, preferably in the range of about 2-8, more preferably in the range of about 2.5-6. The concentration of thiolate in the reaction mixture will generally be in the range of about 0.5 to 20 mM, more usually in the range of about 1 to 10 mM, where the particular concentration within limits is not critical. The concentration will be related to the amount of auric salt in the medium, the particular thiolate and the desired size of the nanoparticles.

The medium will be a hydroxylic medium, usually an aqueous medium, maintaining the passivated gold particles in solution, and capable of being miscible with a precipitating solvent. Generally, the solvents may have 0 to 100 percent of a solvent, desirably being mixed solvents. Conveniently, the solvent may include less than a precipitating amount of the solvent to be added in the next stage to control the precipitation. Conveniently, the medium is an aqueous alkanolic medium, particularly methanolic, although higher alcohols may find use, generally of not more than about 6 carbon atoms, usually not more than about 3 carbon atoms. Less conveniently, other water miscible solvents may be used, e.g., DMF, if desirable. Depending upon whether the use of the nanoparticles requires a substantially uniform range of particle sizes or a broader range is acceptable, the amount and choice of the alkanol will vary. Generally, the amount of alkanol can be in the range of about 20 to 80, more usually 20 to 70 volume percent. For a narrow particle size range, one will usually have from about 20 to 70 volume percent, preferably about 25 to 50 volume percent. The amount of non-solvent, depending upon other variables, controls the solubility, size and dispersivity of the particles in that one can determine empirically the solvent composition that provides the most uniform composition of the desired size by varying the amount of precipitating alkanol and analyzing the product for size and uniformity. As already indicated the amount of other components can affect the response the product to variations in alkanol. Also, the addition of the alkanol may affect other variables, such as pH. Similarly, by appropriate choice of conditions, one can obtain gold nanoparticle molecules of defined composition.

Where the addition of the auric salt and thiolate results in a cloudy medium, the medium may be readily clarified by adding a small amount of an inorganic base. Usually, some base will be included in the reaction medium.

Other components may be included in the reaction medium for particular purposes.

The temperature for the reaction is not critical. Reaction time can be varied, so long as the time is sufficient for at least substantially complete reaction. Usually, the reaction will be complete in greater than about 2 hours up to 12 hours, more usually within 3 hours to 6 hours. Ambient temperatures are satisfactory, so there is no need for strict temperature control. Elevated and reduced temperatures will change the size and potentially the distribution of the particles, so that conditions other than those exemplified will be determined empirically.

Without requiring separation or purification, a reductant is added to the medium for formation of the gold nanoparticles. The reductant is commonly a water-compatible metal hydride, such as the alkali metal Group III metal hydrides, such as sodium borohydride, lithium borohydride, sodium trimethoxyborohydride, lithium trimethoxyborohydride, etc., or other reducing compounds that are compatible with the reaction mixture and provide products that are compatible with isolating the MPCs. Generally at least stoichiometric, usually excesses, of the hydride will be used, usually at least about 1.2-fold excess and not more than about 20-fold excess, usually not more than about 10-fold excess. The hydride can be added neat (0% solvent) or dispersed in an aqueous solvent at a convenient concentration and volume, usually not more than about 40%, more usually not more than about 25%, of the volume of the reaction medium. Generally, the reaction medium will be diluted with an appropriate solvent to provide a precipitating medium, conveniently with water, alkanol or a mixture of water and alkanol. Because of the high solubility of the MPCs in water, particularly basic water, the amount of the alkanol necessary for precipitation will vary with the hydroxide concentration and the choice of alkanol. Usually, the medium will be greater than 40%, usually greater than 60% alkanol, e.g., methanol, or other aqueous miscible solvent. The dilution factor will generally be in the range of about 2-20, more usually 5-15. The time and temperature are not critical, ambient conditions being satisfactory and completion of the reaction can be monitored by the termination of additional gold nanoparticles being formed. Generally the reaction will be complete by 12 h, more usually by 6 h. Additional liquid may then be added in which the MPCs are substantially insoluble, conveniently the same liquid that was used as a component in the reaction mixture, in order to ensure that substantially all of the MPCs produced have precipitated.

The product may then be isolated from the reaction medium by filtration, centrifugation, precipitation, combinations thereof, or other suitable separation means. The solid product may be washed with an appropriate liquid, e.g., water, aqueous methanol, etc., to remove any of the reactant and resuspended or maintained as a dry or wet solid. The product may be analyzed by gel electrophoresis, mass spectrometry, transmission electron microscopy, thermogravimetric analysis, differential pulse voltammetry, and elemental analysis.

To prepare crystals, one mode is to disperse the gold nanoparticle precipitate in an appropriate medium, generally an aqueous alkanol medium. The alkanol will generally be present in from about 30 to 60, more usually 35 to 55, volume percent. The gold nanoparticles are induced to form crystals by the addition of inorganic salts and or water-soluble organic salts, either one or more salts. Conveniently, alkali metal halides may be used, such as sodium chloride and sodium bromide, and alkali metal carboxylate salts, such as sodium acetate.

A convenient protocol is to take a pellet of gold nanoparticles, resuspend in 70% methanol and aspirate off the methanol, repeating this 2 or 3 times to wash the particles free of any contamination. The particles are then dried and resuspended in water. Using a crystallization plate, a crystallization liquor, conveniently 0.5 to 2 ml, is added to each well. Onto the surface of the cup, which is used to close the well, is added 0.5 μl of the crystallization liquor and 0.5 μl of an aqueous solution of the gold nanoparticles.

A successful liquor that has been employed using a 40-50% methanolic water, about 200 to 400 mM NaCl, about 50 to 150 mM NaOAc, and about 0-50 mM NaBr, at an acidic pH, from about 2 to 4.

For larger amounts of product to be produced, the described system may be expanded where using a closed system, the dispersion of the gold particles is in vapor equilibrium with the crystallization liquor.

Another method can also be used for producing three-dimensional crystals from the subject MPCs. The crystals can be grown by reducing the volume of a solution of the MPCs until crystals form. Generally, one can reduce the volume by evaporation at reduced pressure, evaporation at ambient or slightly elevated temperature, or in a solution of salt (e.g., NaCl, NaBr, KCl, Ammonium Acetate, or Potassium Acetate) as described above, etc. Different sized crystals can be obtained varying from 5 microns to 1 mm, usually to 500 microns, the crystals being available by virtue of the homogeneity of the MPCs. The crystals can find use for structural determination of the MPC, or as phasing reagents in X-ray crystallography when proteins are bound to the MPCs. The crystals can also find use as has been described for the MPC compositions.

While there are reports of single crystals of gold nanoparticles, two properties distinguish the single crystals reported here: First, the crystals are formed from as-synthesized particles (all other examples of crystals are formed from highly purified material); second, the subject crystals diffract to atomic resolution. No other examples of crystal diffraction to a resolution smaller than the diameter of the core of the particle have been reported for thiolate protected gold nanoparticles.

Substantially any compound can be linked to the MPCs, either directly through a sulfur linkage, displacing the passivating thiolate or indirectly by binding, i.e., covalent or non-covalent binding, to a functional group present on the passivating thiolate. Also, some Lewis bases may be used for substitution, e.g., phosphines, although thiols are the preferred Lewis bases. In this way, the MPCs find use as labels, biochemical sensors, enzyme enhancers, nanoscale building blocks, and immunohistochemical probes. As will be discussed subsequently, the MPCs can be used with nucleic acids for applications utilizing the properties of nucleic acids, with peptide backbone nucleic acids for analogous purposes, and the like. The nanoparticles can also find use in determining protein structure providing a rigid support.

While the subject uniformly sized particles find particular use, particles of less uniform size can find application in a protocol providing rigid, specific binding of proteins. The rigidity finds particular application in structure determinations. The protocol involves displacing the thiolate used for passivating the gold with a scFv (single chain immunoglobulin variable region). The passivating thiolates p-mercaptobenzoic acid or glutathione have been found to be successfully used. The scFv naturally has or is provided with a thiol, conveniently a cysteine, particularly an N- or C-terminal cysteine. The thiol, e.g., cysteine, may be part of a linker, usually not exceeding 30 atoms in the chain, more usually not exceeding 20 atoms in the chain and preferably not exceeding 16 atoms in the chain, where the atoms are carbon, nitrogen, sulfur and oxygen. The thiol may be terminal or internal to the linker. Desirably, the scFv provides a positive charge, particularly at the C-terminal proximal region of the scFv, that is, within about 10 amino acids of the C-terminus, providing further rigidity to the scFv and protein complex. One or more charges, usually not more than 6, may be provided. Lysine, histidine or arginine provide convenient sources of positive charges. The scFv may be to any protein or other molecule of interest. Even small organic molecules may be bound for x-ray determinations or for labeling the small molecules with the MPCs or as a diagnostic, using competitive assays, where the analyte competes with a labeled analyte for binding to the MPCs.

The linker may be conveniently the same or substantially the same as the passivating thiolate or different in accordance with the substitution of the passivating thiolate. For example, when using glutathione as the passivating thiolate, one may use cysteine by itself, or in combination with one or both of glutamate and glycine. The scFv finds particular use for protein structure determination.

For the activation and reduction of the gold nanoparticles any convenient polar non-interfering medium may be employed. The medium may be a single liquid or a mixture of liquids, organic or inorganic, and combinations thereof. Convenient liquids individually or in combination include water, deionized water, ethanol, and methanol. Activation is required for some MPCs, but not others. For example, the PMBA MPCs do not require activation, while glutathione MPCs do.

To activate the gold nanoparticles, they are oxidized with a mild oxidant, including chemical and electrical oxidation. The oxidation should involve a solution potential in the range of about 0.025 to 0.75V resulting in MPCs having from about 1 to 5 charges and a potential in the range of about 0.1 to 0.6v (vs $Ag^+$/AgCl at pH 9). A wide variety of inorganic and organic oxidants may be used. Illustrative oxidants include perchlorates, permanganates, nitrates, and chromates. In carrying out the oxidation, the oxidant is added to a solution of the MPCs at an appropriate buffered basic pH, with the MPCs generally being at a concentration in the range of about 0.1 to 1.0, while the amount of the oxidant will generally be at a multiple of molar ratio to the MPCs in the range of about 1 to 10, more usually 2 to 8 and conveniently 4 to 6. Conveniently, the solution is buffered, generally at a basic pH in the range of about 7-12, more usually about 8-10, with the buffer at a concentration of about 0.05 to 2M, usually not more than about 0.5M. Any non-interfering buffer may be used to provide the basic pH, such as borate, phosphate, tris, HEPES, tris-glycine, and MOPS. The time for the reaction to completion is ordinarily less than 1 h and will usually be allowed to proceed for at least about 5 min. Ambient temperature is satisfactory. The oxidant may then be removed by any conventional means, e.g., dialysis, HPLC, methanol precipitation, etc.

The MPCs may then be reacted with a thiolate or other Lewis base to substitute the thiolate present in the MPCs. This reaction will normally be carried out under the following conditions: at a pH and with a buffer as described above; 0.1M Borate, pH 9.0 at 37° C.-42° C. for 1 hour with 1 mg/ml scFv and 1 mM MPC having been shown to be successfully employed. Thereafter, to stabilize the MPCs from any further reaction, the MPCs are reduced with a mild reducing agent. The reductant may be dissolved in any convenient medium that is water soluble, including water, and added to the MPCs containing aqueous medium. The amount of reductant will be based on the empirically determined molar equivalent, determined by the MPC concentration, as determined spectrophotometrically. Usually, not more than about 3-fold excess will be used.

The reducing reaction is conveniently performed under ambient conditions and allowed to react for at least about 0.5 h and usually not more than about 6 h. If desired, the reaction mixture may be stored for an extended period at about 4° C. for 6 h or more. The resulting product may be used in a variety of ways, one of which has been discussed previously, for rigidly supporting a protein for structural determination.

The subject MPCs have a broad spectrum of uses, based on the metal nanoparticles that are the core of the composition, the thiolates that are used for passivating, the compounds that can be used for substitution of the thiolates to become bound to the core and the compounds that can be used to modify the compounds bound to the gold core. Furthermore, applications can be based on the interactions between the gold core and the entities bound to the gold core. The nature of the compounds bound to the core may be organic molecules, such as small synthetic organic molecules, that includes ligands, drugs, inhibitors, etc., poly(amino acids), e.g., oligopeptides and proteins, saccharides, e.g., mono- and polysaccharides, lipids, organic polymers, inorganic polymers, etc. The MPCs may be used as catalysts, for example, for carbon monoxide oxidation.

When conjugated to proteins, the MPCs may be used as probes, e.g., immunochemical probes and histochemical probes. They may also be used as "molecular rulers" measuring the distance between two proteins connected to gold nanoparticles, performing the measurement by SAXS or plasmon resonance changes.

The MPCs may also serve as labels to observe transport of proteins in a cell, where binding of a ligand results in translocation; one may conjugate a binding entity to the MPCs, which upon introduction into a cell will bind with its complementary member to form a complex that is labeled with the MPCs. In addition, the binding entity conjugate can be used to specifically denature the complementary protein by irradiating the cells with energy of the appropriate wavelength to be absorbed by the particular MPCs. Depending upon the size of the MPCs, the MPCs will absorb radiation of different wavelengths, e.g., microwave, that will be released as heat and locally denature the proteins in the complex to which the MPCs are bound.

The MPCs can be used with nucleic acids in many different ways. The DNA may be chosen so that programmed self-assembly of an arbitrarily 3D arrangement of gold clusters is obtained, using hybridization of complementary sequences. By appropriate choice of sequences one can produce extended nucleic acid structures in which the gold particles are embedded. These arrangements may be secondarily treated, either by metallization or by mixing in a thiolated conducting polymer to create a set of single electron transistors that take advantage of the quantized double layer charging properties of the MPCs.

Because of the metallic nature of the gold nanoparticles, such networks will be electrically conductive and may serve as wires, have the ability to absorb and emit light, provide photoreactivity, act as sensors in having a bulk impedance change upon binding of molecules to the array.

The nucleic acid-MPC conjugates can be used in the purification and identification of nucleic acids. The MPCs can be used as labels for immuno/histochemical probes to identify nucleic acid sequences. The MPCs may serve to stabilize nucleic acids, both DNA and RNA when introduced into a cell. The MPCs can be used as electron donors and acceptors. In this way the MPCs can serve as a reservoir of electrons for catalytic action, chemical reduction, or can serve as an electron sink, for oxidations.

While specific ranges for preparing the MPCs and the modification of the MPCs have been given and are further illustrated in the working exemplification, in light of the number of variables involved in the preparation of the MPCs, one may empirically modify specific conditions, such as concentrations, mode and rate of addition of the reagents, composition of the solvent, choice of the thiolate, temperature, etc, in accordance with what has been shown in this patent application, where products may be obtained that will have properties coming within the ranges indicated above. Thus, the subject application provides guidelines for the production of the subject gold nanoparticle compositions that may be varied.

Experimental

The following is an exemplary protocol for making monodispersed p-mercaptobenzoic acid MPCs:

Dissolve 0.001 mol HAuCl4 (Sigma) in 80 mL methanol; Dissolve 0.0031 mol p-mercaptobenzoic acid (PMBA, TCI America) in 32 mL water; Mix the solutions; A golden-white suspension should result; Add 8 mL 1.0 M Sodium Hydroxide; The solution should clarify; Allow this solution to stir at room temperature, in a sealed vessel, for 24-36 hours; Adjust the concentration of methanol to 73.3%, by, for example, taking 100 mL of the mixture specified above, and adding 700 mL methanol and 200 mL water. For the example dilution given, 4.1 mL of Sodium Borohydride in water is added, for a total molar excess of Sodium Borohydride to Gold of 2.95X. The reduction reaction is allowed to proceed in a vented vessel for at least 4.25 hours. It may be allowed to react up to 16 hours. Methanol is added to induce further product precipitation, up to an additional volume. The product may be collected on either a frit filter or in a low speed centrifugation step. The product is dissolved in aqueous buffer, for example 0.1M Borate, pH 9, and precipitated again with methanol to remove unreacted reactants and disulfide. The precipitation is carried out twice.

MPC Synthesis and Oxidation/Reduction. MPCs (monolayer-protected gold clusters) were synthesized and purified by high density—polyacrylamide gel electrophoresis with a 20T/7C gel as described. (Schaaff, T. G.; Whetten, R. L., Giant Gold-Glutathione Cluster Compounds: Intense Optical Activity in Metal-Based Transitions. *Journal of Physical Chemistry B* 2000, 104, (12), 2630-2641). The identity of band 2 (Schaaf, et al., 2000, supra) was verified by ESI-MS, and band 5 was used in this work. A Beer's law extinction coefficient of 821500 at a wavelength 241 nm was determined for band 5 and used to calculate MPC concentration. Oxidation and reduction were for 10 min at room temperature in 0.1 M Borate, pH 9.0, with a 5-fold molar excess of oxidant or reductant to MPC unless otherwise noted. Most oxidants and reductants could be removed by methanol precipitation of the glutathione MPC. Oxidants soluble in methanol, such as potassium permanganate, were removed by dialysis in a 1000MWCO Spectra-Por 300 µl volume microdialysis device.

Reduction for reactivity quenching was done by adding the calculated, empirically determined molar amount of reductant to each reaction. Reductants were dissolved or diluted in distilled water. The reductions were allowed to proceed for at least 1 hour at room temperature, and were frequently stored overnight at 4° C. prior to further purification or analysis.

Solution potentials were measured with a Corning Ag/AgCl pH electrode with the exterior electrode isolated as the reference electrode and a platinum wire used as a working electrode. The solution potentials of several redox compounds measured in this way, including quinhydrone, sodium nitrate, and potassium ferricyanide, compared favorably with literature values. Several oxidants, including ferricyanide, iodine, and chromate, were incompatible with the glutathione-MPC, causing decomposition of the nanoparticle.

scFv Mutagenesis and Expression. The NC10 scFv, encoded in the pGC-NC10 vector (Dolezal, O.; Pearce, L. A.; Lawrence, L. J.; McCoy, A. J.; Hudson, P. J.; Kortt, A. A., ScFv multimers of the anti-neuraminidase antibody NC10: shortening of the linker in single-chain Fv fragment assembled in V(L) to V(H) orientation drives the formation of dimers, trimers, tetramers and higher molecular mass multimers. *Protein Eng* 2000, 13, (8), 565-74.) with a 15-residue (GGGGS)$_3$ linker was mutated to introduce a C-terminal cysteine residue. A FLAG tag was first inserted at the N-terminus, by cleaving the vector with SacI (NEB Biolabs), gel purifying the product, and religating the cleaved vector in the presence of the FLAG-tag encoding oligonucleotides 5'-cgactataaagacgatgacgataagggcatcgagct-3' (SEQ ID NO:1) and 5'-cgatgcccttatcgtcatcgtctttatagtcgagct-3' (SEQ ID NO:2). C-terminal cysteine mutants were created by gel purifying the SacII/EcoRI cleaved plasmid, which removes the C-terminal sequence, and ligating the oligonucleotides 5'-ggcagaatgcggataag-3' (SEQ ID NO:3) and 5'-aattcttatccgcattctgccgc-3' (SEQ ID NO:4) for NC10-116C, 5'-ggcaaaagaatgcggataag-3' (SEQ ID NO:5) and 5'-aattcttatccgcattcttttgccgc-3' (SEQ ID NO:6) for NC10-117C, and 5'-ggcaaaaaaggaatgcggataag-3' (SEQ ID NO:7) and 5'-aattcttatccgcattcctttttgccgc-3' (SEQ ID NO:8) for NC10-118C. Mutants NC10-C112, -C113, -C114, and -C115 were made by deleting single amino acids from NC10-C116, using a QuickChange Site Directed Mutagenesis Kit (Stratagene). The primers used to create NC10-C112 were 5'-ggaccacggtcaccgaatgcggataaga-3' (SEQ ID NO:9) and 5'-tcttatccgcattcggtgaccgtggtcc-3' (SEQ ID NO:10), those for NC10-C113 were 5'-ccacggtcaccgtcgaatgcggataaga-3' (SEQ ID NO:11) and 5'-tcttatccgcattcgacggtgaccgtgg-3' (SEQ ID NO:12), those for NC10-C114 were 5'-cggtcaccgtctccgaatgcgataaga-3' (SEQ ID NO:13) and 5'-tcttatccgcattcggagacggtgaccg-3' (SEQ ID NO:14), and those for NC10-C115 were 5'-tcaccgtctccgcggaatgcggataaga-3' (SEQ ID NO:15) and 5'-tcttatccgcattccgcggagacggtga-3' (SEQ ID NO:16). To add positive charge near the gold cluster conjugation site, two lysine residues were introduced into NC10-C116 with a QuickChange kit and the primers 5'-gaccacggtcaccgtctccaagaaagaatgcggataagaattcag-3' (SEQ ID NO:17) and 5'-ctgaattcttatccgcattctttcttggagacggtgaccgtgtc-3' (SEQ ID NO:18).

NC10 scFv and mutants were expressed and purified as described (Dolezal, et al., 2000, supra), except that Top10F' (Invitrogen) *E. coli* was cultured in 4.5 L, and the filtered osmotic shock fluid was concentrated with a Vivaflow 50 concentrator (Vivascience). The yield of NC10 cysteine mutants was 5 to 10 fold less than that of wild type NC10.

MPC/scFv Conjugate Formation and Purification. The scFv (20 µM) was reduced with either TCEP (tris-2-carboxyethyl phosphine) (64 µM) or mercaptoethylamine (44 mM) at 37° C. for 30 minutes typically in 200 mM glycine/100 mM Tris, pH 8.0. If mercaptoethylamine was used as reductant, the scFv was subsequently gel filtered into 0.1 M Borate, pH 9.0, using a BioRad 10DG desalting column. A volume of oxidized gold clusters in 0.1 M Borate, pH 9.0 was added to give final concentrations for the scFv of 12.5 µM and for the clusters of 375 µM, and the mixture was kept for 1 h at 42° C. Optimal concentrations of TCEP and oxidized MPC were separately determined for each labeling experiment. Ion exchange chromatography was performed on a 1 mL HiTrap Q column (Pharmacia) with a BioRad HR pumping station. Elution was with a gradient of 20 column vol from 20 mM Tris, pH 8 to 20 mM Tris, pH 8, 1 M NaCl. Gel filtration was performed on a Superdex 200 3.2/30 column in phosphate-buffered saline (Chidsey, C., Charge manipulation of GSH protected gold clusters. In Ackerson, C. a. K., Roger, Ed. Stanford, 2003.) with an Ettan FPLC system. A 50 µl injection loop was used and 50 µl sample volumes were injected.

Gel Electrophoresis. SDS-PAGE was performed as described (Sambrook, J.; Russell, D. W., *Molecular Cloning: A Laboratory Manual*. 3rd ed.; Cold Spring Harbor Laboratory Press: Cold Spring Harbor, N.Y., 2001.) Gels were fixed in 40% methanol, 10% acetic acid, 50% water for 30 min, stained (or not) with Coomassie Brilliant Blue, equilibrated in water, washed twice with 1 mM EDTA, twice with water, and agitated with a mixture of equal volumes of silver stain solutions A and B (Sigma) (5 mL of each for a 4×6 cm gel) for ~30 min. If bands did not form within 30 min, the gels were washed twice with water and fresh silver stain solution was added.

Cryoelectron Microscopy. Samples were applied to R2/2 Quantifoil grids, which had been glow discharged under vacuum, and were frozen with a vitrobot. Images were acquired on an FEI T12 transmission electron microscope, equipped with a liquid nitrogen cooled cryostage, operated at 100 kV, at magnifications between 52,000 and 67,000, with the use of a CCD detector.

Particles were isolated and analyzed by cryoelectron microscopy. Particles of 1 and 2 nm size having 104 and 144 gold atoms were observed.

Additional Preparations. A second study was performed to investigate the effect of varying the different components of the preparation of the MPCs. The procedure substantially followed the above described procedure for the preparation of the MPCs. Stock solutions were prepared of the gold salt in methanol and the PMBA in water containing NaOH. (The volume of the stock solution A is not indicated in the following table as it is determined by the amount of gold salt added to the reaction mixture.) The volume and pH is adjusted by addition of methanol and water containing any additional NaOH to provide the desired pH 11. The reaction is then allowed to proceed for 4.5 h while agitated in a rotating wheel. To the reaction mixture is then added sufficient $NaBH_4$ to reduce the gold ions to atomic gold. The reaction is usually complete within about 5 h. To the reaction mixture is then added 100 μl of 2.5M NaCl and 1 ml of MeOH and the mixture spun at 4000 rpm for 10 min. The pellet is suspended in 1 ml 70% aqueous methanol and spun again. The resulting pellet is isolated and allowed to dry overnight in the hood.

The following table indicates the reaction components and their amounts.

TABLE 1

| Stock solution A | |
| --- | --- |
| mmHAuCl$_4$ | 28 |
| Methanol (ml) | 15 |
| Stock solution B | |
| PMBA mM | 93.48 |
| ddH$_2$O (ml) | 13.86 |
| NaOH 10M (ml) | 0.25 |

TABLE 2

|  | 1 | 2 | 3 | 4 | 5 | 6 | 7 | 8 | 9 | 10 | 11 | 12 |
| --- | --- | --- | --- | --- | --- | --- | --- | --- | --- | --- | --- | --- |
| HAuCl mM | 0.80 | 0.80 | 0.80 | 0.80 | 3.0 | 3.0 | 3.0 | 3.0 | 9.00 | 9.00 | 9.00 | 9.00 |
| PMBA: AU | 3.0 | 3.0 | 3.0 | 3.0 | 3.0 | 3.0 | 3.0 | 3.0 | 3.00 | 3.00 | 3.00 | 3.00 |
| NaBH$_4$: Au | 3.4 | 3.4 | 3.4 | 3.4 | 3.4 | 3.4 | 3.4 | 3.4 | 3.4 | 3.4 | 3.4 | 3.4 |
| % Methanol | 27.0 | 37.0 | 47.0 | 57.0 | 27.0 | 37.0 | 47.0 | 57.0 | 27.0 | 37.0 | 47.0 | 57.0 |
| Temp. °C. | 30.0 | 30.0 | 30.0 | 30.0 | 30.0 | 30.0 | 30.0 | 30.0 | 30.0 | 30.0 | 30.0 | 30.0 |
| Stock B, ml | 0.26 | 0.26 | 0.26 | 0.26 | 0.097 | 0.097 | 0.097 | 0.097 | 0.29 | 0.29 | 0.29 | 0.29 |
| *Methanol ml | 0.24 | 0.34 | 0.44 | 0.54 | 0.16 | 0.26 | 0.36 | 0.46 | 0.0 | 0.05 | 0.15 | 0.25 |
| *ddH$_2$0 ml | 0.70 | 0.60 | 0.50 | 0.40 | 0.63 | 0.63 | 0.63 | 0.63 | 0.44 | 0.34 | 0.24 | 0.14 |
| Tot. vol. ml | 1.0 | 1.0 | 1.0 | 1.0 | 1.0 | 1.0 | 1.0 | 1.0 | 1.0 | 1.0 | 1.0 | 1.0 |
| NaBH$_4$ (150 mM; ml) | .018 | .018 | .018 | .018 | 0.068 | 0.068 | 0.068 | 0.068 | 0.204 | 0.204 | 0.204 | 0.204 |

*Total amount in the final reaction mixture. Some of the numbers are rounded off, but additional significant figures can be determined from the ratios and concentrations of the stock solutions.

Figure 7:
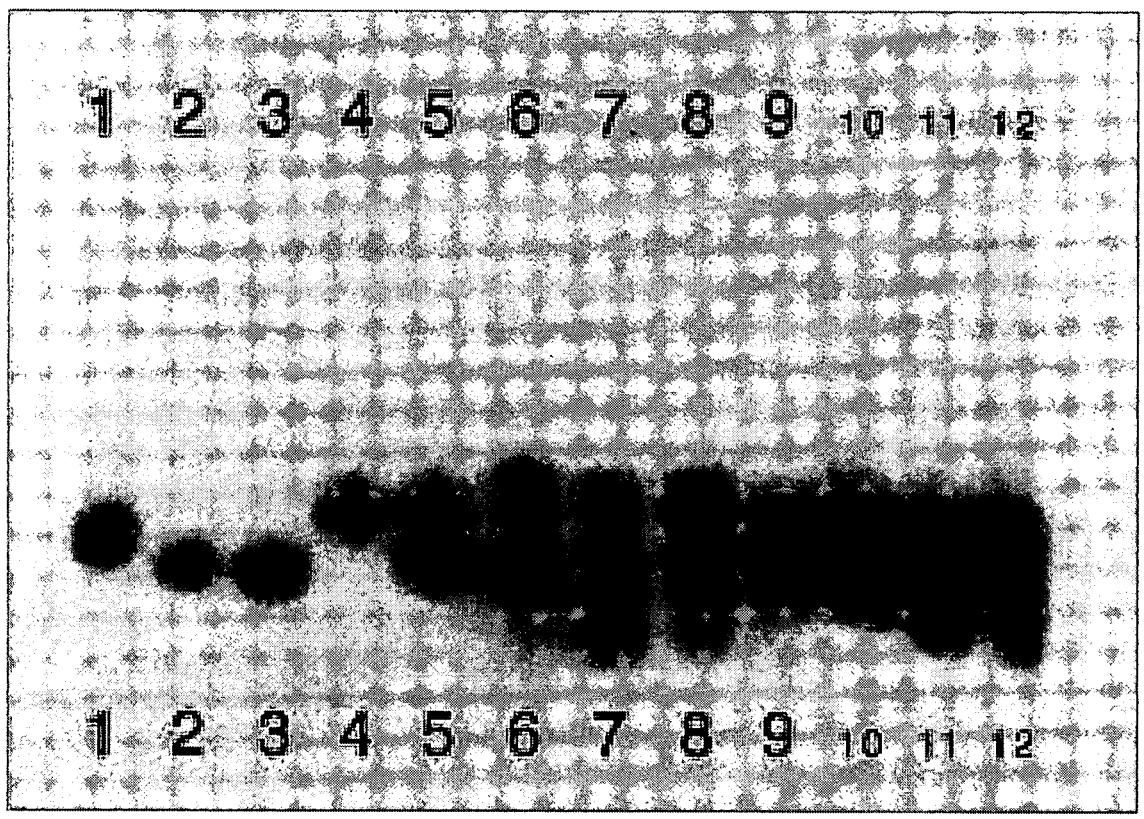
FIG. 7 shows the gel results of preparations of nanoparticles using varying amounts of methanol and gold salt. The lane descriptions are as follows:
Lane 1: 1 μl Sample Jan. 25, 2007, 1, 0.8 mM Au, 27% MeOH; Lane 2: 1 μl Sample Jan. 25, 2007, 2, 0.8 mM Au, 37% MeOH; Lane 3: 1 μl Sample Jan. 25, 2007, 3, 0.8 mM Au, 47% MeOH; Lane 4: 1 μl Sample Jan. 25, 2007, 4, 0.8 mM Au, 57% MeOH; Lane 5: 1 μl Sample Jan. 25, 2007, 5, 3.0 mM Au, 27% MeOH; Lane 6: 1 μl Sample Jan. 25, 2007, 6, 3.0 mM Au, 37% MeOH; Lane 7: 1 μl Sample Jan. 25, 2007, 7, 3.0 mM Au, 47% MeOH; Lane 8: 1 μl Sample Jan. 25, 2007, 8, 3.0 mM Au, 57% MeOH; Lane 9: 1 μl Sample Jan. 25, 2007, 9, 9.0 mM Au, 27% MeOH; Lane 10: 1 μl Sample Jan. 25, 2007, 10, 9.0 mM Au, 37% MeOH; Lane 11: 1 μl Sample Jan. 25, 2007, 11, 9.0 mM Au, 47% MeOH; Lane 12: 1 μl Sample Jan. 25, 2007, 12, 9.0 mM Au, 57% MeOH.

The results of the product of the gel chromatograph using 20% polyacrylamide gel are shown in FIG. 7. Consideration should be given to the difficulties in loading the gel and operating the gel as to the bands in the lanes. The results demonstrate that at the low gold concentration small monodispersed MPC compositions are obtained, with a somewhat greater range and size using higher concentrations of gold salt. The methanol amounts do not appear to affect the product composition significantly under these conditions. The particle sizes are in the range of about 1 to 4 nm with the examples 1-4 being about 1-1.5 nm.

In the next study the effect of variations in the ratio of PMBA to Au was studied. The following table indicates the reaction components and their amounts using the same stock solutions as described above.

TABLE 3

|  | 1 | 2 | 3 | 4 | 5 | 6 | 7 | 8 | 9 | 10 | 11 | 12 |
| --- | --- | --- | --- | --- | --- | --- | --- | --- | --- | --- | --- | --- |
| HAuCl mM | 3.00 | 3.00 | 3.00 | 3.00 | 3.00 | 3.00 | 3.00 | 3.00 | 3.00 | 3.00 | 3.00 | 3.00 |
| PMBA: AU | 1.00 | 1.45 | 1.91 | 2.36 | 2.82 | 3.27 | 3.73 | 4.18 | 4.64 | 5.09 | 5.55 | 6.00 |
| NaBH$_4$: Au | 3.40 | 3.40 | 3.40 | 3.40 | 3.40 | 3.40 | 3.40 | 3.40 | 3.40 | 3.40 | 3.40 | 3.40 |
| % Methanol | 47 | 47 | 47 | 47 | 47 | 47 | 47 | 47 | 47 | 47 | 47 | 47 |
| Temp. °C. | 30 | 30 | 30 | 30 | 30 | 30 | 30 | 30 | 30 | 30 | 30 | 30 |
| Stock B, ml | 0.03 | 0.05 | 0.06 | 0.08 | 0.09 | 0.11 | 0.12 | 0.14 | 0.15 | 0.17 | 0.18 | 0.19 |
| *Methanol ml | 0.36 | 0.36 | 0.36 | 0.36 | 0.36 | 0.36 | 0.36 | 0.36 | 0.36 | 0.36 | 0.36 | 0.36 |
| *ddH$_2$0 ml | 0.50 | 0.48 | 0.47 | 0.45 | 0.44 | 0.42 | 0.41 | 0.39 | 0.38 | 0.36 | 0.35 | 0.34 |
| Tot. vol. ml | 1.0 | 1.0 | 1.0 | 1.0 | 1.0 | 1.0 | 1.0 | 1.0 | 1.0 | 1.0 | 1.0 | 1.0 |
| NaBH$_4$ (150 mM; ml) | 0.068 | 0.068 | 0.068 | 0.068 | 0.068 | 0.068 | 0.068 | 0.068 | 0.068 | 0.068 | 0.068 | 0.068 |

*Total amount in the final reaction mixture. Some of the numbers are rounded off, but additional significant figures can be determined from the ratios and concentrations of the stock solutions.

Figure 8:
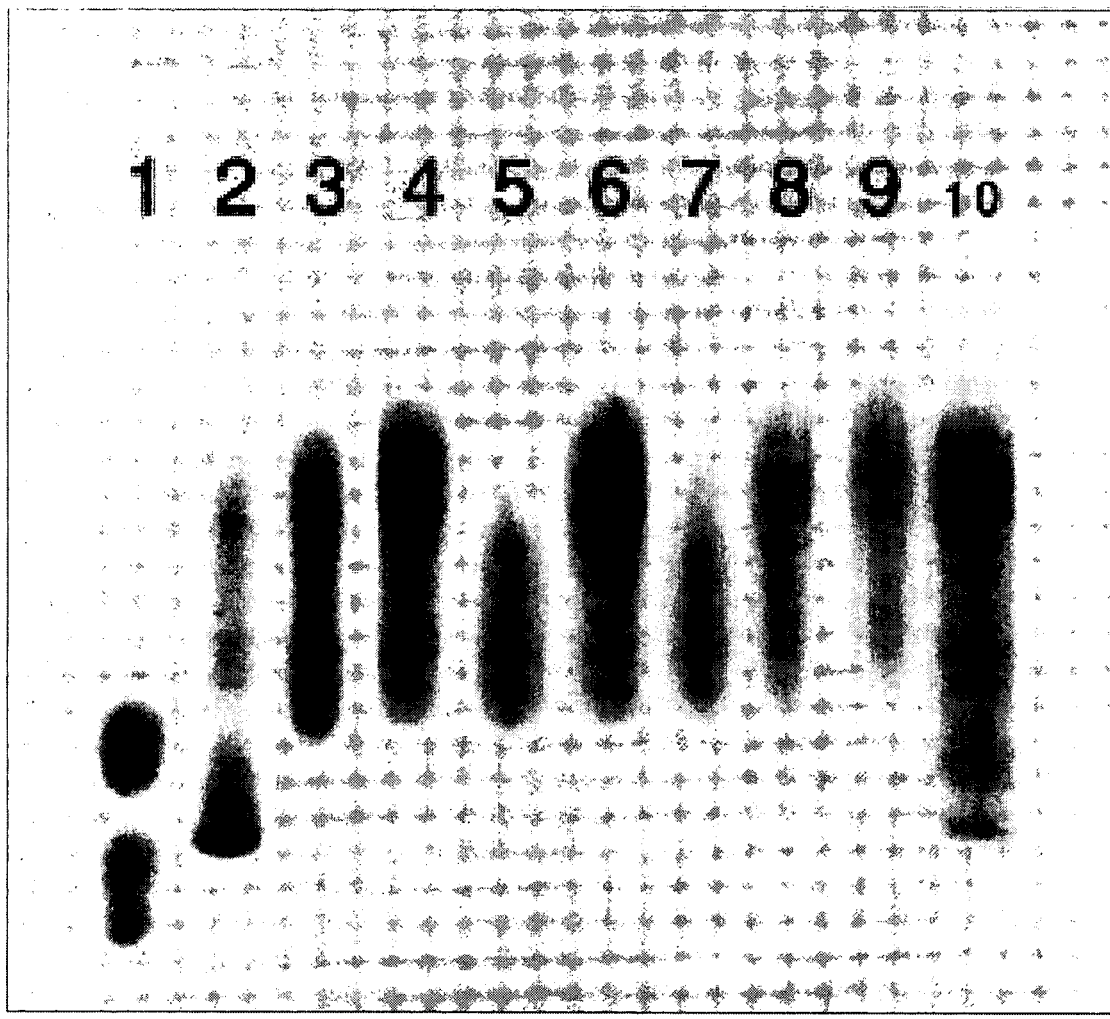
FIG. 8 shows the gel results of preparations of nanoparticles using varying ratios of PMBA to gold. The lane description is as follows:
Lane 1: 1 μl, Jan. 26, 2007, 4; Lane 2: 1 μl, Jan. 26, 2007, 5; Lane 3: 1 μl, Jan. 26, 2007, 6; Lane 4: 1 μl, Jan. 26, 2007, 7; Lane 5: 1 μl, Jan. 26, 2007, 8; Lane 6: 1 μl, Jan. 26, 2007, 9; Lane 7: 2 μl, Jan. 26, 2007, 10; Lane 8: 1 μl, Jan. 26, 2007, 11; Lane 9: 1 μl, Jan. 26, 2007, 12; Lane 10:1 μl, Jan. 25, 2007, 7.

The results of the gel chromatograph are shown in FIG. 8. See also the above comments concerning the gel chromatograph. It should be noted that the first three reaction mixtures precipitated and were water insoluble. Therefore, they do not appear in the gel and column referred to as one is no.4 in the table with successive bands being related to successive columns in the table. Under the conditions employed, having less than 2 moles of PMBA does not give a water-soluble product. The compositions do not seem to vary with increasing mole ratios of PMBA to Au and the products appear to have MPCs in a narrow range of sizes.

It is evident from the above results that the subject methodology provides for greatly improved gold nanoparticle compositions in having a narrow size distribution of particles at or below about 5 nm. Improved methods for replacing the passivated thiolates allow for an expanded variety of gold nanoparticles having greatly improved chemical and physical properties in light of their narrow size distribution and ease of substitution. The subject gold nanoparticles compositions find use in rigidly maintaining complexes of scFv's with their complementary proteins to permit accurate structure determinations using electron microscopy.

The gold nanoparticles can be conjugated to biomolecules for detection as single molecules using multiphoton light microscopy, as labels in immunochemical reactions or immunoassays, to produce conductive nucleic acid compositions when conjugated to nucleic acids, for protein structure determination, and the like. The gold nanoparticles conjugated with nucleic acids can be used as immunochemical probes, identifying chromosomal sequences, identifying snps, alleles and mutations, etc. The nucleic acid conjugated nanoparticles can also be used in templating.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A method for preparing gold nanoparticles of narrow size distribution and under about 10 nm in diameter, said method comprising:
   in a first step, in a basic hydroxylic medium of aqueous methanol combining an auric salt with a reducing thiolate to form gold-thiolate, wherein said thiolate is in a mole ratio to said auric salt in the range of about 2 - 10:1; and
   in a second step, reducing said gold-thiolate in a precipitating particle size controlling medium with a water compatible reducing agent to produce a precipitate of thiolate passivated gold nanoparticles of narrow size distribution.

2. A method for preparing gold nanoparticles of narrow size distribution and under about 10 nm in diameter, said method comprising:
   in a first step, in a basic hydroxylic medium combining an auric salt with a borohydride to form gold-thiolate, wherein the mole ratio of borohydride to gold is 2-10:1; and
   in a second step, reducing said gold-thiolate in a precipitating particle size controlling medium with a water compatible reducing agent to produce a precipitate of thiolate passivated gold nanoparticles of narrow size distribution.

3. A method for preparing gold labeled rigidly held proteins, said method comprising:

reacting thiolate passivated gold particles of less than about 10nm with a thiol-containing scFv whereby said thiol-containing scFv displaces thiolate on said gold particles and becomes bound to said gold particles, wherein said scFv is complexed with a complementary protein prior to said reacting.

4. A method according to claim 3, wherein said thiolate passivated gold particles are prepared according to a method comprising:

in a first step, in a basic hydroxylic medium combining an auric salt with a reducing thiolate to form gold-thiolate; and in a second step, reducing said gold-thiolate in a precipitating particle size controlling medium with a water compatible reducing agent to produce a precipitate of thiolate passivated gold nanoparticles of narrow size distribution.

5. A method for preparing gold nanoparticles of narrow size distribution and under about 10 nm in diameter, said method comprising:

in a first step, in a basic aqueous hydroxylic medium combining an auric salt with a borohydride to form gold-thiolate, wherein the mole ratio of borohydride to gold is 2-10:1; and in a second step, adding a water-compatible metal hydride reductant to said medium to produce thiolate passivated gold nanoparticles of narrow size distribution.

6. A method for preparing gold labeled rigidly held biological molecules, said method comprising:

oxidatively activating thiolate passivated gold particles of less than about 10 nm;

reacting said oxidatively activated thiolate passivated gold particles with a thiol-containing scFv to form scFv containing gold particles; and reducing said scFv containing gold particles to prevent further reaction.

7. A method according to claim 6, wherein said oxidation is electrolytic.

8. A method according to claim 6, wherein said oxidation is with a chemical oxidizing reagent.

9. A method for preparing gold nanoparticles of narrow size distribution and under about 10 nm in diameter, said method comprising:

in a first step, in a basic hydroxylic medium combining an auric salt with a reducing thiolate to form gold-thiolate, wherein said first step proceeds for a time in the range of 24 to 36 hours; and in a second step, reducing said gold-thiolate in a precipitating particle size controlling medium with a water compatible reducing agent to produce a precipitate of thiolate passivated gold nanoparticles of narrow size distribution.

10. The method of claim 3, wherein said thiolate passivated gold particles are prepared according to a method comprising:

in a first step, in a basic hydroxylic medium combining an auric salt with a reducing thiolate to form gold-thiolate; and in a second step, adding a water-compatible metal hydride reductant to said medium to produce thiolate passivated gold nanoparticles of narrow size distribution.

* * * * *

```
                        SEQUENCE LISTING

<160> NUMBER OF SEQ ID NOS: 22

<210> SEQ ID NO 1
<211> LENGTH: 36
<212> TYPE: DNA
<213> ORGANISM: artificial
<220> FEATURE:
<223> OTHER INFORMATION: for mutagenesis

<400> SEQUENCE: 1
cgactataaa gacgatgacg ataagggcat cgagct                              36

<210> SEQ ID NO 2
<211> LENGTH: 36
<212> TYPE: DNA
<213> ORGANISM: artificial
<220> FEATURE:
<223> OTHER INFORMATION: for mutagenesis

<400> SEQUENCE: 2
cgatgccctt atcgtcatcg tctttatagt cgagct                              36

<210> SEQ ID NO 3
<211> LENGTH: 17
<212> TYPE: DNA
<213> ORGANISM: artificial
<220> FEATURE:
<223> OTHER INFORMATION: for mutagenesis

<400> SEQUENCE: 3
ggcagaatgc ggataag                                                   17

<210> SEQ ID NO 4
<211> LENGTH: 23
<212> TYPE: DNA
<213> ORGANISM: artificial
<220> FEATURE:
<223> OTHER INFORMATION: for mutagenesis

<400> SEQUENCE: 4
aattcttatc cgcattctgc cgc                                            23
```

```
<210> SEQ ID NO 5
<211> LENGTH: 20
<212> TYPE: DNA
<213> ORGANISM: artificial
<220> FEATURE:
<223> OTHER INFORMATION: for mutagenesis

<400> SEQUENCE: 5
ggcaaaagaa tgcggataag                                              20

<210> SEQ ID NO 6
<211> LENGTH: 26
<212> TYPE: DNA
<213> ORGANISM: artificial
<220> FEATURE:
<223> OTHER INFORMATION: for mutagenesis

<400> SEQUENCE: 6
aattcttatc cgcattcttt tgccgc                                       26

<210> SEQ ID NO 7
<211> LENGTH: 23
<212> TYPE: DNA
<213> ORGANISM: artificial
<220> FEATURE:
<223> OTHER INFORMATION: for mutagenesis

<400> SEQUENCE: 7
ggcaaaaaag gaatgcggat aag                                          23

<210> SEQ ID NO 8
<211> LENGTH: 29
<212> TYPE: DNA
<213> ORGANISM: artificial
<220> FEATURE:
<223> OTHER INFORMATION: for mutagenesis

<400> SEQUENCE: 8
aattcttatc cgcattcctt ttttgccgc                                    29

<210> SEQ ID NO 9
<211> LENGTH: 28
<212> TYPE: DNA
<213> ORGANISM: artificial
<220> FEATURE:
<223> OTHER INFORMATION: for mutagenesis

<400> SEQUENCE: 9
ggaccacggt caccgaatgc ggataaga                                     28

<210> SEQ ID NO 10
<211> LENGTH: 28
<212> TYPE: DNA
<213> ORGANISM: artificial
<220> FEATURE:
<223> OTHER INFORMATION: for mutagenesis

<400> SEQUENCE: 10
tcttatccgc attcggtgac cgtggtcc                                     28

<210> SEQ ID NO 11
<211> LENGTH: 28
<212> TYPE: DNA
<213> ORGANISM: artificial
<220> FEATURE:
<223> OTHER INFORMATION: for mutagenesis
```

```
<400> SEQUENCE: 11
ccacggtcac cgtcgaatgc ggataaga                                    28

<210> SEQ ID NO 12
<211> LENGTH: 28
<212> TYPE: DNA
<213> ORGANISM: artificial
<220> FEATURE:
<223> OTHER INFORMATION: for mutagenesis

<400> SEQUENCE: 12
tcttatccgc attcgacggt gaccgtgg                                    28

<210> SEQ ID NO 13
<211> LENGTH: 28
<212> TYPE: DNA
<213> ORGANISM: artificial
<220> FEATURE:
<223> OTHER INFORMATION: for mutagenesis

<400> SEQUENCE: 13
cggtcaccgt ctccgaatgc ggataaga                                    28

<210> SEQ ID NO 14
<211> LENGTH: 28
<212> TYPE: DNA
<213> ORGANISM: artificial
<220> FEATURE:
<223> OTHER INFORMATION: for mutagenesis

<400> SEQUENCE: 14
tcttatccgc attcggagac ggtgaccg                                    28

<210> SEQ ID NO 15
<211> LENGTH: 28
<212> TYPE: DNA
<213> ORGANISM: artificial
<220> FEATURE:
<223> OTHER INFORMATION: for mutagenesis

<400> SEQUENCE: 15
tcaccgtctc cgcggaatgc ggataaga                                    28

<210> SEQ ID NO 16
<211> LENGTH: 28
<212> TYPE: DNA
<213> ORGANISM: artificial
<220> FEATURE:
<223> OTHER INFORMATION: for mutagenesis

<400> SEQUENCE: 16
tcttatccgc attccgcgga gacggtga                                    28

<210> SEQ ID NO 17
<211> LENGTH: 45
<212> TYPE: DNA
<213> ORGANISM: artificial
<220> FEATURE:
<223> OTHER INFORMATION: for mutagenesis

<400> SEQUENCE: 17
gaccacggtc accgtctcca agaaagaatg cggataagaa ttcag                 45
```

```
<210> SEQ ID NO 18
<211> LENGTH: 45
<212> TYPE: DNA
<213> ORGANISM: artificial
<220> FEATURE:
<223> OTHER INFORMATION: for mutagenesis

<400> SEQUENCE: 18
ctgaattctt atccgcattc tttcttggag acggtgaccg tggtc                45

<210> SEQ ID NO 19
<211> LENGTH: 3
<212> TYPE: PRT
<213> ORGANISM: artificial
<220> FEATURE:
<223> OTHER INFORMATION: C terminus of mutant

<400> SEQUENCE: 19

Glu Cys Gly
1

<210> SEQ ID NO 20
<211> LENGTH: 4
<212> TYPE: PRT
<213> ORGANISM: artificial
<220> FEATURE:
<223> OTHER INFORMATION: C terminus of mutant

<400> SEQUENCE: 20

Ala Glu Cys Gly
1

<210> SEQ ID NO 21
<211> LENGTH: 5
<212> TYPE: PRT
<213> ORGANISM: artificial
<220> FEATURE:
<223> OTHER INFORMATION: C terminus of mutant

<400> SEQUENCE: 21

Ala Lys Glu Cys Gly
1               5

<210> SEQ ID NO 22
<211> LENGTH: 6
<212> TYPE: PRT
<213> ORGANISM: artificial
<220> FEATURE:
<223> OTHER INFORMATION: C terminus of mutant

<400> SEQUENCE: 22

Ala Lys Lys Glu Cys Gly
1               5
```